(12) United States Patent
Tomohiro et al.

(10) Patent No.: US 7,994,616 B2
(45) Date of Patent: Aug. 9, 2011

(54) MULTILAYERED LEAD FRAME FOR A SEMICONDUCTOR LIGHT-EMITTING DEVICE

(75) Inventors: Hidekazu Tomohiro, Kameoka (JP); Masayuki Fujii, Kyoto (JP); Norio Satou, Kameoka (JP); Tomoyuki Yamada, Kameoka (JP); Tomio Kusano, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/509,065

(22) Filed: Jul. 24, 2009

(65) Prior Publication Data

US 2009/0283791 A1    Nov. 19, 2009

Related U.S. Application Data

(62) Division of application No. 10/542,419, filed as application No. PCT/JP2004/000152 on Jan. 13, 2004, now Pat. No. 7,692,277.

(30) Foreign Application Priority Data

Jan. 16, 2003 (JP) ................................. 2003-007988

(51) Int. Cl.
    *H01L 23/495* (2006.01)
(52) U.S. Cl. ................ 257/677; 257/666; 257/E23.054
(58) Field of Classification Search .................. 257/676, 257/677, 666, 81, 91, 98, 99, 100
See application file for complete search history.

(56) References Cited

U.S. PATENT DOCUMENTS

| | | |
|---|---|---|
| 4,979,017 A | 12/1990 | Mii |
| 5,424,578 A | 6/1995 | Fujita et al. |
| 5,670,797 A | 9/1997 | Okazaki |
| 5,936,264 A | 8/1999 | Ishinaga |
| 6,150,711 A | 11/2000 | Kom et al. |
| 6,352,634 B1 | 3/2002 | Forderer et al. |
| 2001/0022390 A1 | 9/2001 | Waitl et al. |
| 2002/0047186 A1 | 4/2002 | Tellkamp |
| 2004/0089898 A1 | 5/2004 | Ruhnau et al. |
| 2007/0246724 A1* | 10/2007 | Wen et al. ............... 257/98 |

(Continued)

FOREIGN PATENT DOCUMENTS

DE    198 50 526 A1    5/2000

(Continued)

OTHER PUBLICATIONS

Japanese Office Action issued in corresponding Japanese Patent Application No. JP 2004-003413, dated Dec. 12, 2006.

(Continued)

*Primary Examiner* — Wael M Fahmy
*Assistant Examiner* — Sarah K Salerno
(74) *Attorney, Agent, or Firm* — McDermott Will & Emery LLP

(57) ABSTRACT

A lead frame (100) for a semiconductor device is formed by applying nickel plating (102), palladium plating (103), and gold flash plating (104) substantially entirely to lead frame body (101) such as copper thin plate in this order, and further applying silver plating (105) selectively to part of an inner part that is to be enclosed with a package of the semiconductor device. The lead frame (100) may also include a base of the package. The silver plating contributes to an excellent light reflectance and wire bonding efficiency of the inner part, whereas the gold flash plating contributes to an excellent resistance to corrosion and soldering efficiency of an outer part that is outside the package.

1 Claim, 7 Drawing Sheets

U.S. PATENT DOCUMENTS

2008/0006837 A1* 1/2008 Park et al. .................. 257/98

FOREIGN PATENT DOCUMENTS

| | | |
|---|---|---|
| EP | 1 094 519 A1 | 4/2001 |
| JP | 61-078150 | 4/1986 |
| JP | 61-148883 | 7/1986 |
| JP | 62-263665 | 11/1987 |
| JP | 01-305551 | 12/1989 |
| JP | 10-237691 | 9/1998 |
| JP | 11-008341 | 1/1999 |
| JP | 11-008341 A | 1/1999 |
| JP | 11-346008 | 12/1999 |
| JP | 2001-127229 | 5/2001 |
| JP | 2002-517327 | 6/2002 |
| JP | 2002-335012 | 11/2002 |

OTHER PUBLICATIONS

United States Office Action issued in U.S. Appl. No. 10/542,419, mailed Nov. 17, 2009.

United States Office Action issued in U.S. Appl. No. 12/716,938 dated Dec. 9, 2010.

United States Office Action issued in U.S. Appl. No. 12/716,938 dated Apr. 20, 2011.

* cited by examiner

MULTILAYERED LEAD FRAME FOR A SEMICONDUCTOR LIGHT-EMITTING DEVICE

RELATED APPLICATIONS

This application is a Divisional of U.S. patent application Ser. No. 10/542,419, filed Dec. 29, 2005 now U.S. Pat. No. 7,692,277, which is a U.S. National Phase under 35 U.S.C. §371 of International Application No. PCT/JP2004/000152, filed on Jan. 13, 2004, which in turn claims the benefit of Japanese Application No. 2003-007988, filed on Jan. 16, 2003, the entire contents of each of which are hereby incorporated by reference.

TECHNICAL FIELD

The present invention relates to a lead frame for a semiconductor device, and in particular relates to techniques of improving a light reflectance of a lead frame.

BACKGROUND ART

Conventionally, gold-silver alloy flash plating is formed at an outermost layer of a lead frame for a semiconductor device, to ensure a high resistance to corrosion. An example of such techniques is disclosed in Unexamined Japanese Patent Application Publication No. H11-008341.

FIG. 6 is a representation of a construction of a lead frame described in the above document. In the drawing, a lead frame 900 is formed by applying nickel plating 902, palladium plating 903, and gold-silver alloy flash plating 904 to a lead frame body 901 in this order. According to the document, the lead frame 900 having this construction exhibited an excellent corrosion resistance in a salt-spray test.

However, though this construction certainly has a high corrosion resistance, it has only a low light reflectance. This being so, especially when a semiconductor light-emitting element such as an LED is mounted on the lead frame to form a semiconductor light-emitting device, the lead frame cannot sufficiently reflect rear light of the light-emitting element, which impairs the luminous efficiency of the entire device.

DISCLOSURE OF THE INVENTION

The present invention was conceived in view of the problem described above, and aims to provide a lead frame for a semiconductor device with an improved light reflectance.

The stated object can be achieved by a lead frame for a semiconductor device, including: a lead frame body; and a plurality of metal coatings which include a silver or silver-alloy coating and are applied to the lead frame body, wherein the silver or silver-alloy coating is an outermost metal coating of a predetermined part of the lead frame, the predetermined part being to be enclosed with a package of the semiconductor device.

Here, the plurality of metal coatings may further include a gold or gold-alloy coating which is an outermost metal coating of a part of the lead frame other than the predetermined part.

Here, the silver or silver-alloy coating may have a thickness of 0.1 μm or more.

Here, a base that is a part of the package may be inserted to the lead frame with a portion of the predetermined part being enclosed with the base.

According to these constructions, the silver or silver-alloy coating delivers an excellent light reflectance and wire bonding efficiency of the predetermined part which is enclosed with the package, and the gold or gold-alloy coating delivers an excellent resistance to corrosion and soldering efficiency of the other part which is outside the package.

Thus, the lead frame exhibits a high light reflectance in the predetermined part. Accordingly, when used in a semiconductor light-emitting device, the lead frame efficiently reflects rear light of a semiconductor light-emitting element, with it being possible to enhance the luminous efficiency of the entire device.

Here, the gold or gold-alloy coating may substantially entirely cover the lead frame body, wherein the silver or silver-alloy coating is applied over the gold or gold-alloy coating only in the predetermined part.

According to this construction, the silver or silver-alloy coating partially covers the lead frame body, whereas the gold or gold-alloy coating entirely covers the lead frame body. This simplifies the manufacturing process of the lead frame.

Here, the plurality of metal coatings may further include a nickel or nickel-alloy coating and a palladium or palladium-alloy coating, wherein the nickel or nickel-alloy coating, the palladium or palladium-alloy coating, the gold or gold-alloy coating, and the silver or silver-alloy coating are applied in the stated order, with the nickel or nickel-alloy coating and the palladium or palladium-alloy coating substantially entirely covering the lead frame body.

According to this construction, the palladium or palladium-alloy coating has a high high-temperature stability, which makes the lead frame suitable for high-temperature leadless soldering.

Here, the plurality of metal coating may further include a gold or gold-alloy coating, wherein the silver or silver-alloy coating may substantially entirely covers the lead frame body, and the gold or gold-alloy coating is applied over the silver or silver-alloy coating only in the part of the lead frame other than the predetermined part (FIG. 7).

According to this construction, the gold or gold-alloy coating partially covers the lead frame body, whereas the silver or silver-alloy coating entirely covers the lead frame body. This simplifies the manufacturing process of the lead frame.

Here, the plurality of metal coatings may further include a nickel or nickel-alloy coating and a palladium or palladium-alloy coating, wherein the nickel or nickel-alloy coating, the palladium or palladium-alloy coating, the silver or silver-alloy coating, and the gold or gold-alloy coating are applied in the stated order, with the nickel or nickel-alloy coating and the palladium or palladium-alloy coating substantially entirely covering the lead frame body.

According to this construction, the palladium or palladium-alloy coating has a high high-temperature stability, which makes the lead frame suitable for high-temperature leadless soldering.

Here, the silver or silver-alloy coating may be applied except at least one part of the portion enclosed with the base.

According to this construction, the adhesion between the lead frame and a resin that forms the package is strong in the area where the silver or silver-alloy coating is absent in the predetermined part. This maintains the seal of the package and improves the resistance to corrosion in the predetermined part.

Here, a semiconductor light-emitting element may be mounted on the lead frame to form a semiconductor light-emitting device.

According to this construction, the semiconductor light-emitting device is formed using the lead frame that has an excellent light reflectance in the predetermined part. This makes it possible to efficiently reflect rear light of the semiconductor light-emitting element, which contributes to a high luminous efficiency of the entire device.

BEST MODE FOR CARRYING OUT THE INVENTION

Figure 1:
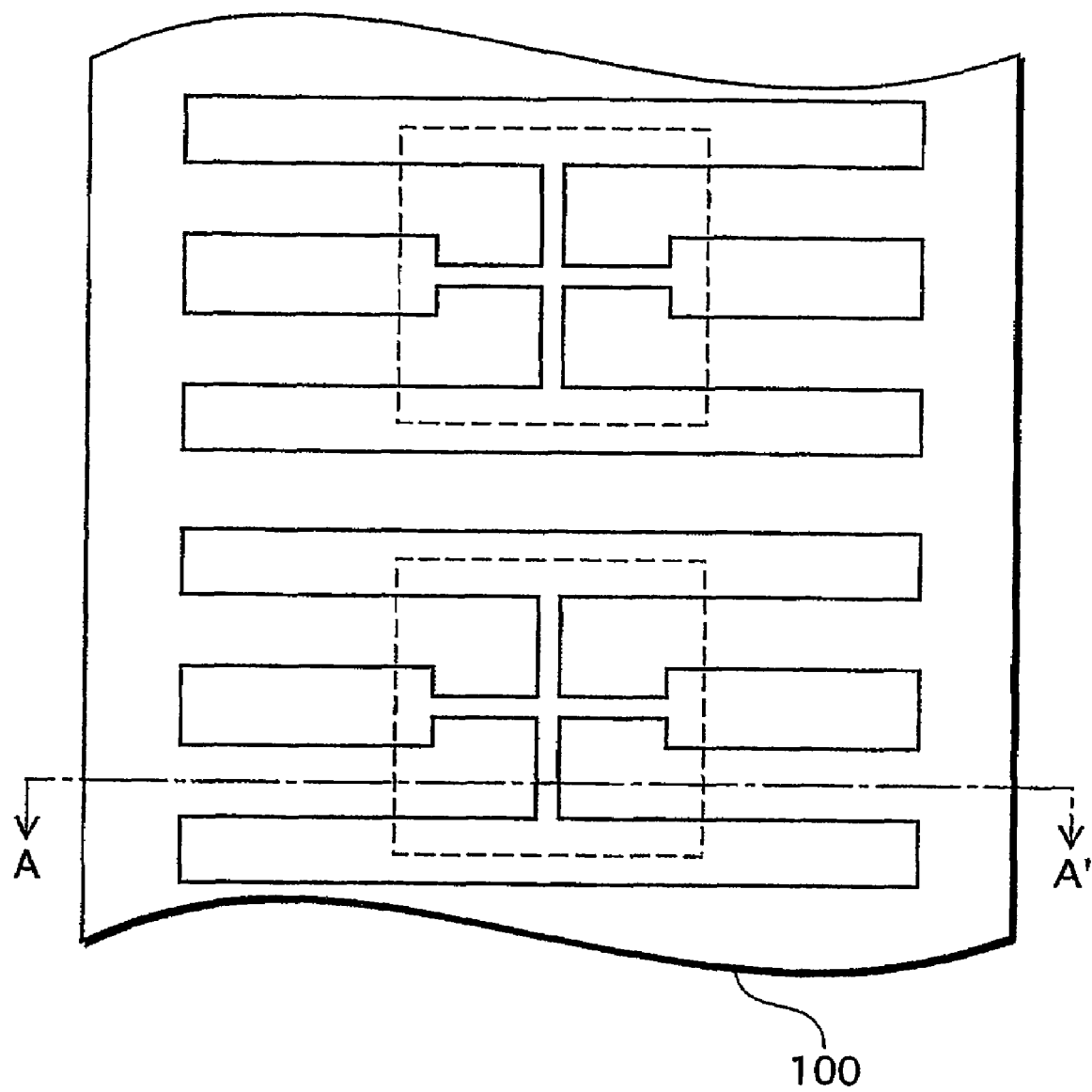
FIG. 1 is a top view of a lead frame to which an embodiment of the invention relates.

An embodiment of the present invention is described in detail below, by referring to the drawings.
(Pattern of a Lead Frame)

FIG. 1 is a top view of a lead frame to which the embodiment of the present invention relates.

In the drawing, a lead frame 100 is formed by pressing or etching a lead frame body in the illustrated pattern and then plating the lead frame body as described later. For example, the lead frame body is a thin plate of an iron alloy or a copper alloy.

A package for enclosing part of the lead frame 100 and housing a semiconductor element such as a semiconductor light-emitting element is provided in each of the areas indicated by the dashed line boxes. The package includes a base and a cover. The base has a depression for mounting the semiconductor light-emitting element. The cover seals the depression on which the semiconductor light-emitting element is mounted.

In this specification, a part of the lead frame 100 which is inside each of the areas indicated by the dashed line boxes, i.e. which is enclosed with the package, is called an inner part, whereas a part of the lead frame 100 which is outside the package is called an outer part. The inner part includes inner leads. The inner part may also include an element mounting unit that is provided separately from or as part of the inner leads.
(Plating)

Figure 2:
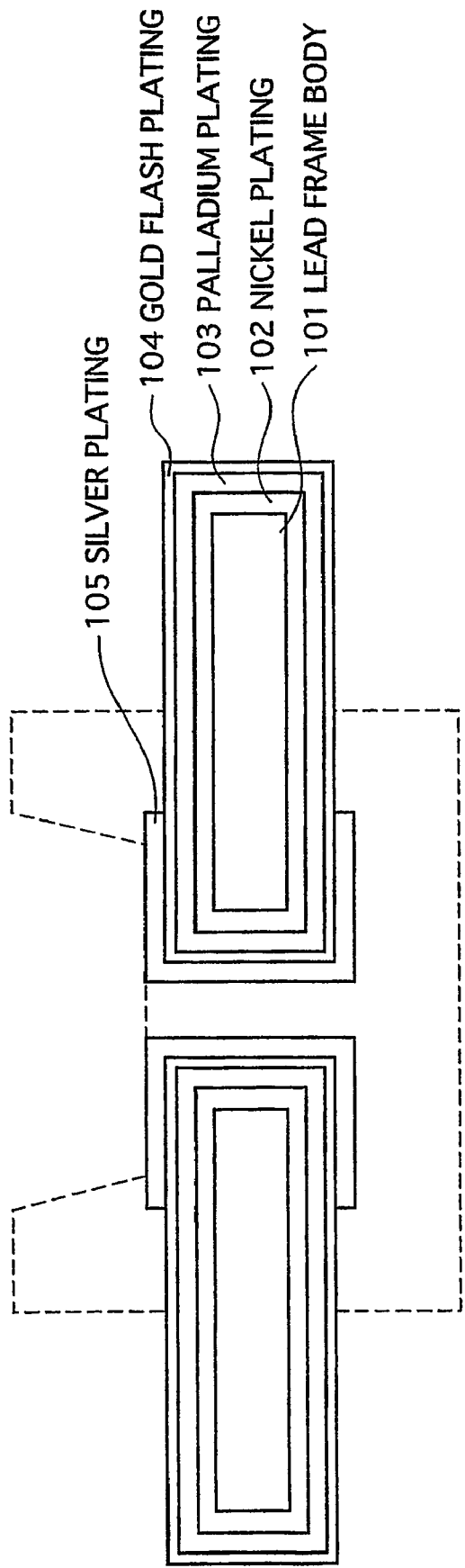
FIG. 2 is a representation of a plating construction of the lead frame shown in FIG. 1.

FIG. 2 is a representation of a plating construction of the lead frame 100, taken along the lines A-A' in FIG. 1.

The lead frame 100 is formed by applying nickel plating 102, palladium plating 103, and gold flash plating 104 to a lead frame body 101 in this order, and further applying silver plating 105 to part of the inner part.

For example, the nickel plating 102 has a thickness of 0.5 to 2.0 µm, the palladium plating 103 has a thickness of 0.005 to 0.07 µm, the gold flash plating 104 has a thickness of 0.003 to 0.01 µm, and the silver plating 105 has a thickness of 0.1 µm or more.

Here, these plating layers may instead be made of alloys. Which is to say, the nickel plating 102 may be nickel-alloy plating, the palladium plating 103 may be palladium-alloy plating, the gold flash plating 104 may be gold-alloy flash plating, and the silver plating 105 may be silver-alloy plating.

After plating, the base of the package is inserted to the area indicated by the dashed lines. The base is made of a white-colored or light-colored insulating resin, such as polyphthalamide. The base has a depression as shown in the drawing, and releases light of the semiconductor light-emitting element placed in the depression in an upward direction. After the semiconductor light-emitting element is placed in the depression, the depression is filled with a sealing transparent resin (e.g. an epoxy resin) to form the cover. The base and the cover together constitute the package.

It should be noted here that the silver plating 105 only partially covers the inner part, i.e., the part of the inner part enclosed with the base is partially not plated with silver.
(Semiconductor Device Using the Lead Frame 100)

Figure 3:
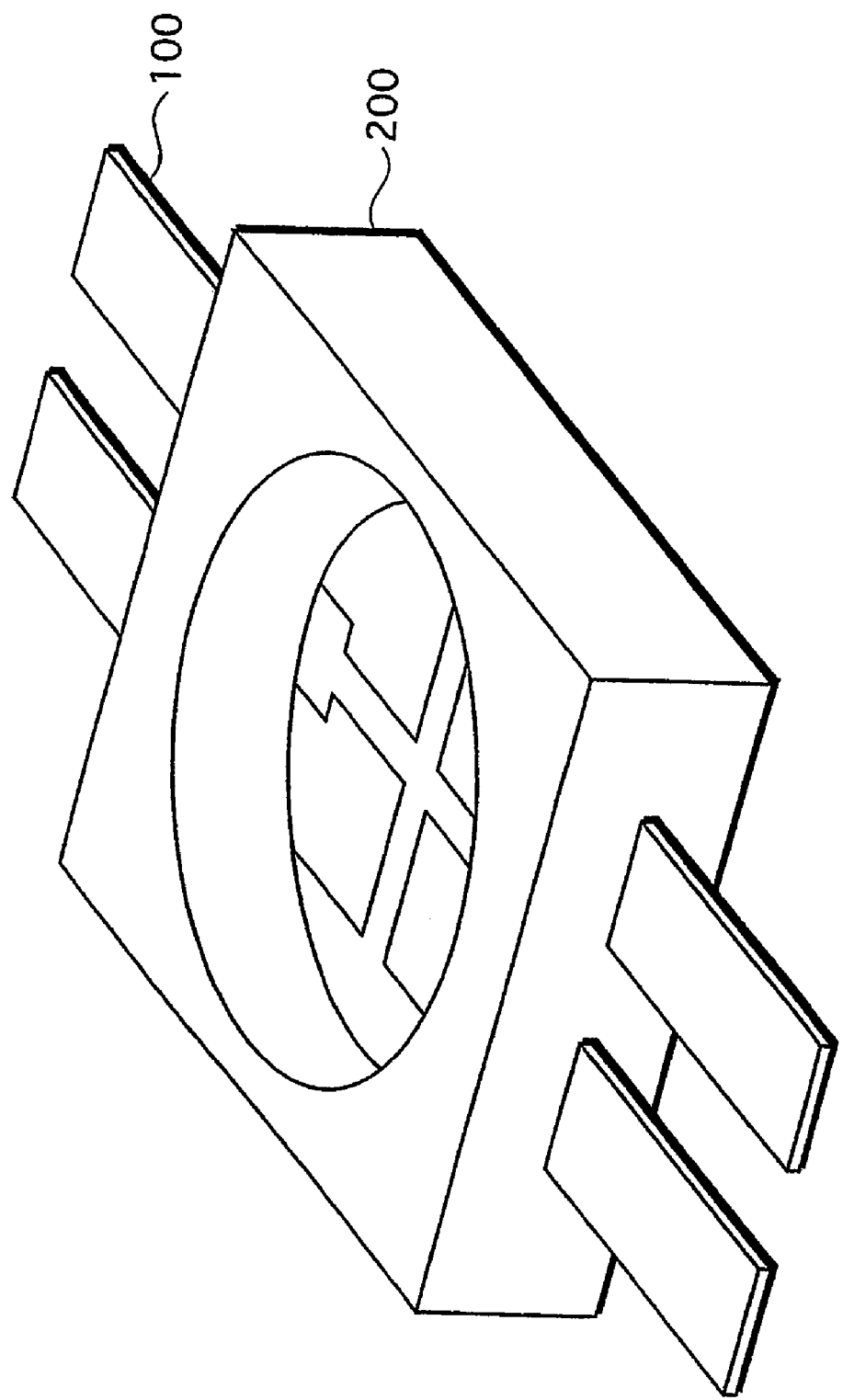
FIG. 3 is a perspective view of the lead frame after a package is formed.

FIG. 3 is a perspective view of the lead frame 100 after a base 200 is formed.

Figure 4:
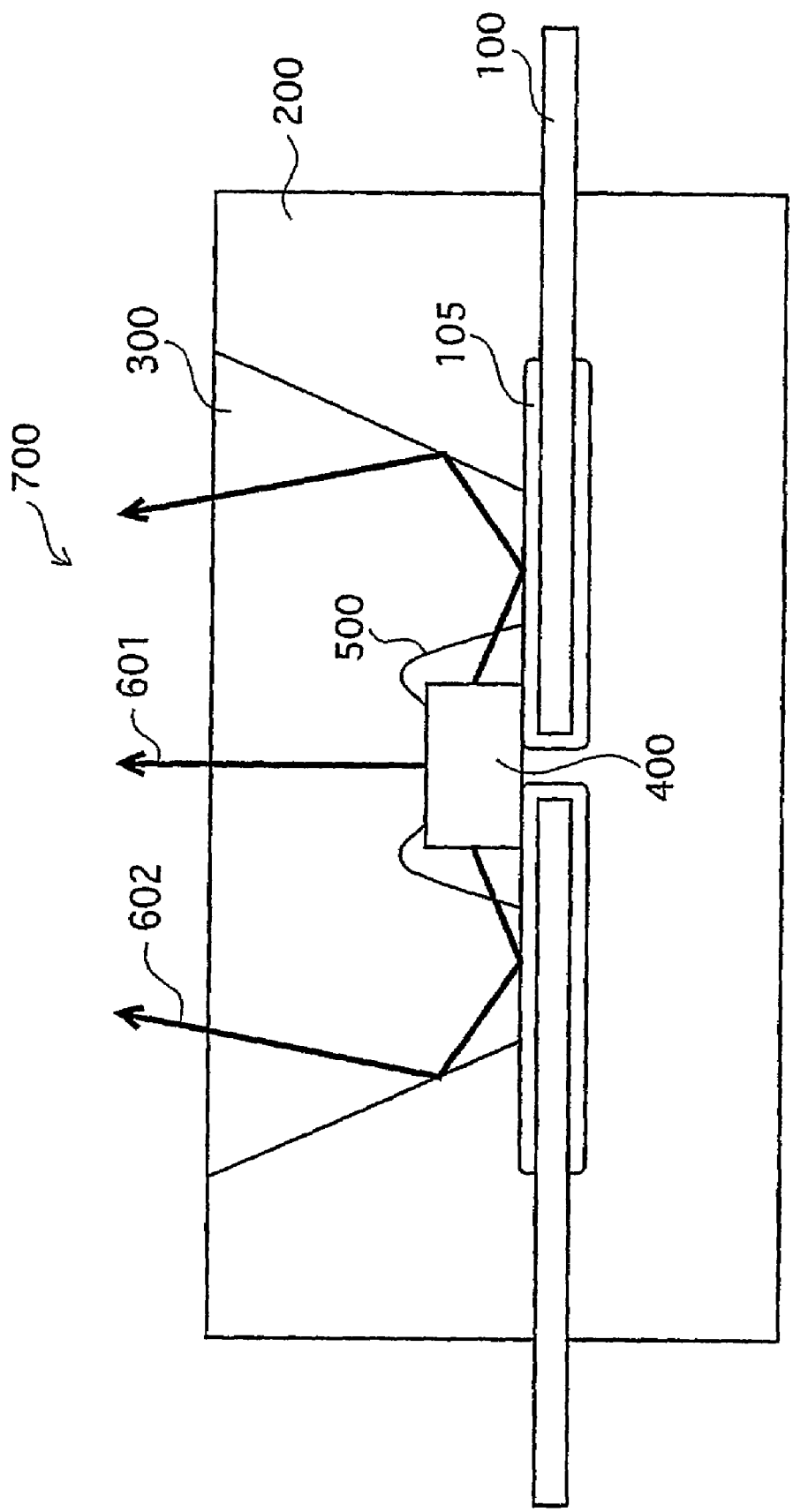
FIG. 4 is a representation of a cross section of a semiconductor light-emitting device that uses the lead frame.

FIG. 4 is a representation of a cross section of a semiconductor light-emitting device 700 which uses the lead frame 100.

The semiconductor light-emitting device 700 is formed by mounting a semiconductor light-emitting element 400 on part of the inner part exposed to the depression of the base 200, connecting the semiconductor light-emitting element 400 with the inner part using bonding wires 500, and then enclosing a transparent resin 300 in the depression to form a cover.

Light 601 of the semiconductor light-emitting element 400 is directly released upward, whereas other light 602 of the semiconductor light-emitting element 400 is reflected off the inner part and the base 200 and then released.

The inventors of the present invention confirmed that such a constructed lead frame has the following excellent properties.
(Light Reflectance)

Figure 5:
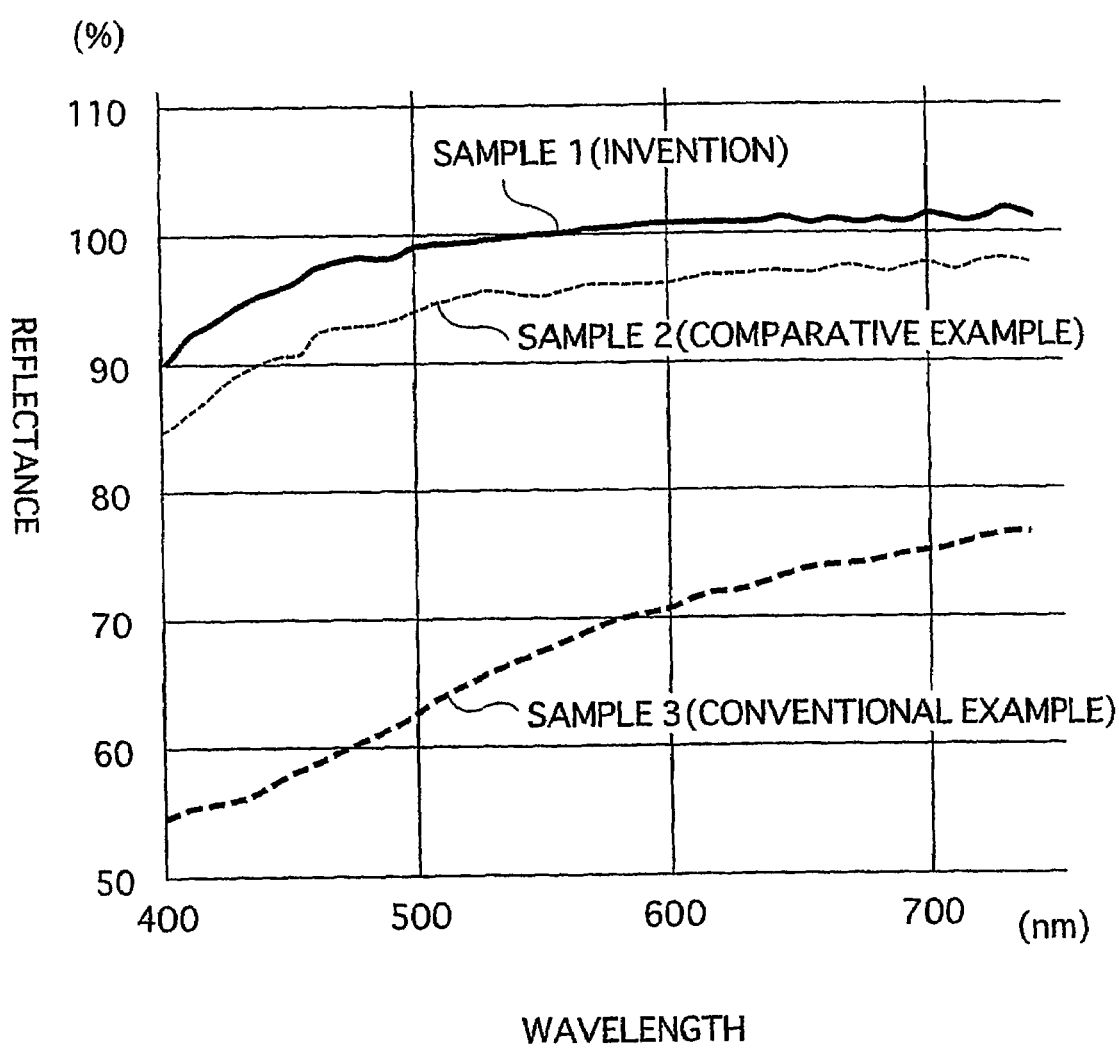
FIG. 5 is a graph for comparing reflectances of lead frames.
Figure 6:
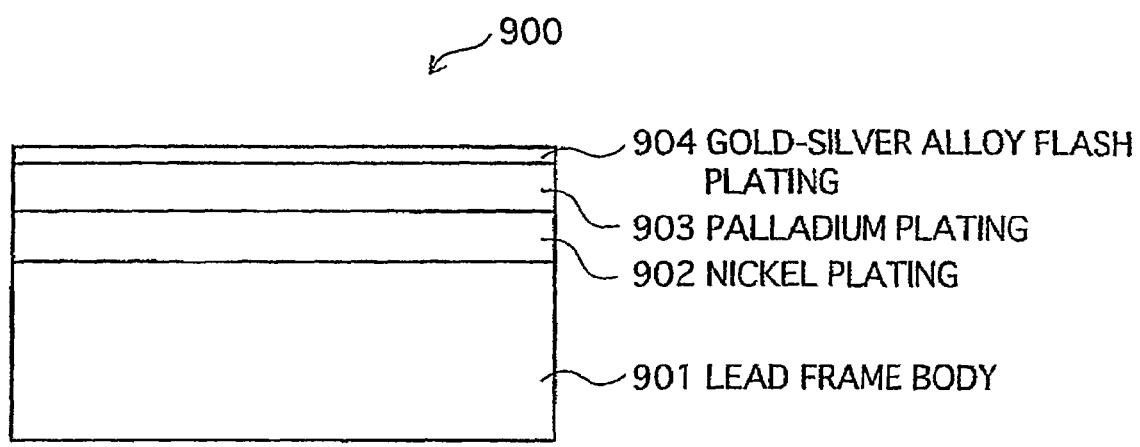
FIG. 6 is a representation of a plating construction of a conventional lead frame.
Figure 7:
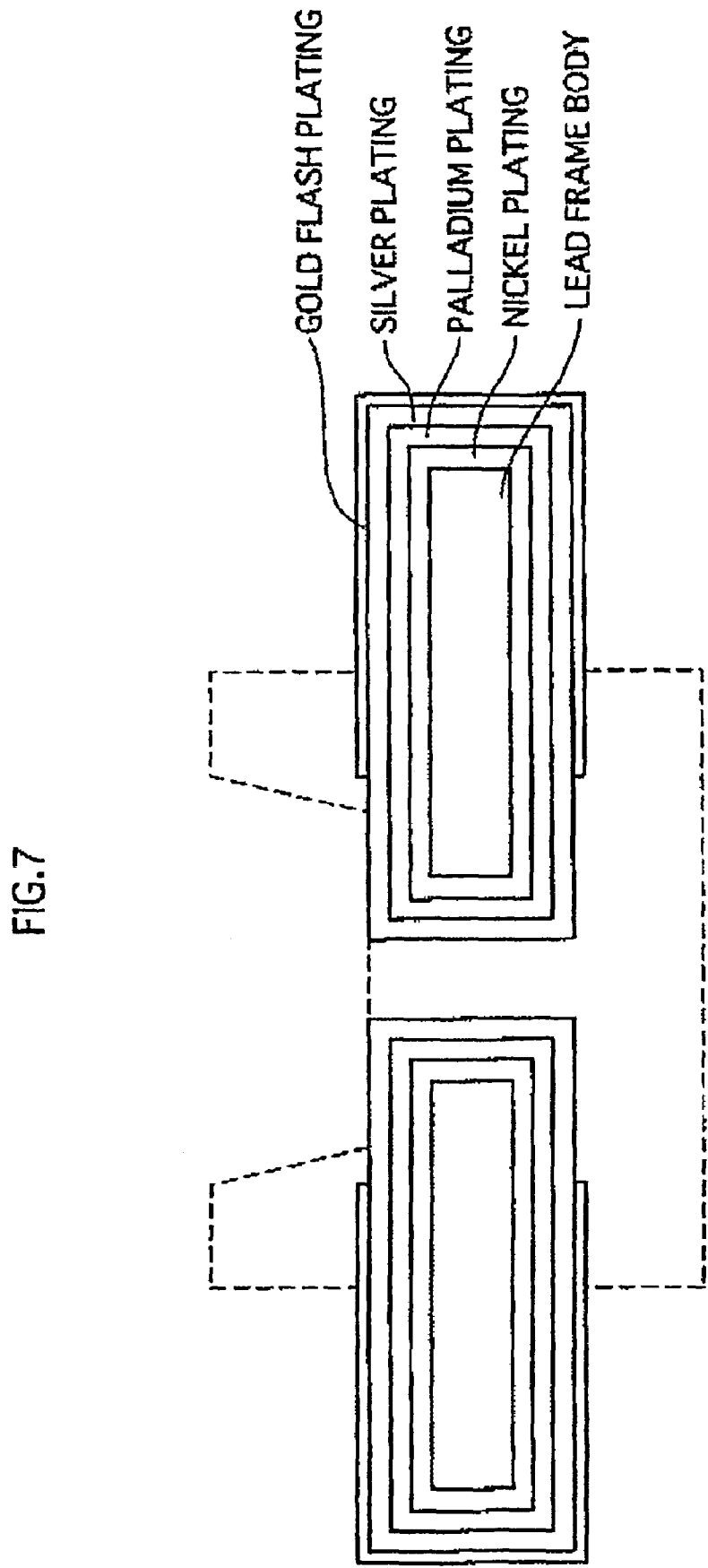
FIG. 7 is a representation of a plating construction of the lead frame of the present invention.

FIG. 5 is a graph for comparing light reflectances of lead frames. A light reflectance of a lead frame of each of sample 1 (the silver-plated lead frame part of the present invention), sample 2 (a comparative example), and sample 3 (a conventional example) was measured using a visible-ultraviolet spectrophotometer, where a light reflectance of barium sulfate is 100.

Sample 1 has the construction described above.

Sample 2 is formed by applying copper strike plating and silver plating that has a thickness of 3 µm to a copper alloy thin plate as a lead frame body, in this order. Sample 2 is used as a comparative example that can deliver a light reflectance similar to the present invention, by single-layer silver plating.

Sample 3 is a conventional lead frame. Sample 3 is formed by applying nickel plating of 1.0 to 1.2 µm in thickness, palladium plating of 0.03 µm in thickness, and gold flash plating of 0.008 µm in thickness to a copper alloy thin plate as a lead frame body, in this order.

As shown in the graph, the silver-plated lead frame part of the present invention has a light reflectance that is at least 25% higher than that of the conventional example and a little higher than that of the comparative example, for visible light of 400 to 700 nm in wavelength.
(Resin Adhesiveness)

Also, the inventors of the present invention measured a shear adhesive strength of the contact surfaces of a resin which forms the base and a palladium-plated lead frame part and a shear adhesive strength of the contact surfaces of the resin and a silver-plated lead frame part. As a result, the inventors found that the shear adhesive strength of the resin and the palladium-plated lead frame part is greater than that of the resin and the silver-plated lead frame part. In view of this, silver plating is provided only partially in the inner part, that is, silver plating is provided in the inner part except a part of the area that is enclosed with the base.

As a result, the resin adheres to the palladium plating layer through the gold flash plating layer, in the portion of the inner part which is not plated with silver. This produces a greater shear adhesive strength than in the portion of the inner part which is plated with silver. Since the gold flash plating layer is extremely thin, it does not significantly affect the shear adhesive strength.

The inventors of the present invention conducted an experiment of soaking samples 1 and 2 in red ink under the same conditions. As a result, red ink did not seep into sample 1 which is not plated with silver in part of the area enclosed with the base, whilst red ink seeped into sample 2 which is entirely plated with silver.

(Other Properties)

In addition, each of the plating layers of the lead frame has the following excellent properties.

The silver plating not only achieves an excellent light reflectance as described above, but also has excellent connectivity with the semiconductor light-emitting element mounted thereon and a high wire bonding efficiency.

The gold flash plating has a high thermal stability, which enhances the soldering efficiency of the outer part.

The palladium plating has a high chemical stability, and so exhibits an excellent resistance to corrosion under high-temperature environments.

The nickel plating serves as base plating, and contributes to a high wire bonding efficiency, a high leadless soldering efficiency, a high corrosion resistance, and a high adhesive strength with the resin that forms the package.

As described above, the lead frame of the present invention has a characteristic construction in which silver or silver-alloy plating is applied as the outermost coating of the inner part, to achieve a favorable light reflectance.

In the above embodiment, this characteristic construction is realized by coating the lead frame body substantially entirely with nickel plating, palladium plating, and gold flash plating in this order, and further coating the inner part of the lead frame with silver plating. However, the construction of the present invention can equally be realized by coating the lead frame body substantially entirely with nickel plating, palladium plating, and silver plating, and further coating the outer part of the lead frame with gold flash plating. Hence this lead frame is included in the present invention, too.

In the above embodiment, each of the metal coatings applied to the lead frame body is referred to as plating for the sake of simplicity. However, the metal coating method of the present invention is not limited to plating. For example, the metal coatings may be formed using a known metal coating method such as electroplating, chemical plating, evaporation, sputtering, or diffusion.

Here, to coat a desired area with a metal, a conventional method such as masking or blasting is applicable.

Industrial Applicability

The present invention can be used for a semiconductor light-emitting device that requires a high luminous efficiency, such as an LED device employed in lighting, indication, decoration, communication, and the like.

The invention claimed is:

1. A semiconductor light-emitting device comprising:
   a package that includes a cover made of a transparent resin and a base made of an insulating resin whose refractive index is different from a refractive index of the cover;
   a lead including an inner part enclosed in the package and an outer part that is outside the package; and
   a semiconductor light-emitting element mounted on the inner part of the lead, wherein:
   an outermost coating of the inner part of the lead includes a first area and a second area, the first area including a silver or silver-alloy and the second area including a gold or gold-alloy,
   the cover is in contact with the first area but not in contact with the second area, and an outermost coating of the outer part is a gold or gold-alloy coating,
   the lead includes a nickel or nickel-alloy coating and a palladium or palladium ally coating,
   the nickel or nickel-alloy coating the palladium or palladium-alloy coating, and the silver or silver-alloy coating substantially entire cover the lead,
   in the fist area the nickel or nickel-alloy coating, the palladium or palladium alloy coating and the silver or silver-alloy are applied in the stated order, and
   in the second area the nickel or nickel-alloy coating, the palladium or palladium-alloy coating, the silver or silver-alloy coating and the gold or gold-alloy are applied in the stated order.

* * * * *